(12) United States Patent
Vermeulen et al.

(10) Patent No.: US 9,141,004 B2
(45) Date of Patent: Sep. 22, 2015

(54) LITHOGRAPHIC APPARATUS AND METHOD

(75) Inventors: Johannes Petrus Martinus Bernardus Vermeulen, Helmond (NL); Johannes Antonius Gerardus Akkermans, Eindhoven (NL); Marinus Maria Johannes Van De Wal, Olrschot (NL); Ruud Antonius Catharina Maria Beerens, Roggel (NL); Yang-Shan Huang, Veldhoven (NL); Wilhelmus Henricus Theodorus Maria Aangenent, 's-Hertogenbosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 339 days.

(21) Appl. No.: 13/428,541

(22) Filed: Mar. 23, 2012

(65) Prior Publication Data

US 2012/0249987 A1 Oct. 4, 2012

Related U.S. Application Data

(60) Provisional application No. 61/469,414, filed on Mar. 30, 2011, provisional application No. 61/491,736, filed on May 31, 2011.

(51) Int. Cl.
*G03B 27/68* (2006.01)
*G03F 7/20* (2006.01)

(52) U.S. Cl.
CPC .......... *G03F 7/7085* (2013.01); *G03F 7/70783* (2013.01)

(58) Field of Classification Search
CPC ...... G03F 7/70783; G03F 7/7085; G03F 7/20
USPC ............................................... 355/66, 72, 52
See application file for complete search history.

(56) References Cited

U.S. PATENT DOCUMENTS 6,023,325 A * 2/2000 Sahlgren et al. ............ 356/73.1
6,404,956 B1 6/2002 Brennan, III et al.
(Continued)

FOREIGN PATENT DOCUMENTS

DE 195 38 747 4/1997
JP 2000-221085 8/2000
JP 2001-508535 6/2001
JP 2001-511895 8/2001

(Continued)

OTHER PUBLICATIONS

Japanese Office Action mailed May 20, 2013 in corresponding Japanese Patent Application No. 2012-067344.

*Primary Examiner* — Deoram Persaud
(74) *Attorney, Agent, or Firm* — Pillsbury Winthrop Shaw Pittman LLP

(57) ABSTRACT

A lithographic apparatus includes: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a deformation sensor to determine deformations of an object of the lithographic apparatus, wherein the deformation sensor includes at least one optical fiber arranged on or in the object, the optical fiber including one or more Bragg gratings, and an interrogation system to interrogate the one or more Bragg gratings.

20 Claims, 10 Drawing Sheets

(56) References Cited

U.S. PATENT DOCUMENTS

| | | | |
|---|---|---|---|
| 7,902,494 B2 * | 3/2011 | Klaver et al. | 250/237 G |
| 8,482,719 B2 | 7/2013 | Van Eijk et al. | |
| 2001/0024275 A1 | 9/2001 | Suzuki et al. | |
| 2003/0156287 A1 | 8/2003 | Cheng | |
| 2006/0268270 A1 | 11/2006 | Kerstan et al. | |
| 2009/0129722 A1 * | 5/2009 | Hao et al. | 385/13 |
| 2011/0026004 A1 | 2/2011 | Van Eijk et al. | |
| 2011/0304839 A1 * | 12/2011 | Beerens et al. | 355/72 |
| 2013/0077072 A1 * | 3/2013 | Spruit et al. | 355/67 |
| 2013/0162963 A1 * | 6/2013 | Spruit et al. | 355/44 |
| 2013/0335722 A1 * | 12/2013 | Aangenent et al. | 355/72 |

FOREIGN PATENT DOCUMENTS

| | | |
|---|---|---|
| JP | 2002-257520 | 9/2002 |
| JP | 2003-202272 | 7/2003 |
| JP | 2003-532102 | 10/2003 |
| JP | 2003-344148 | 12/2003 |
| JP | 2005-134199 | 5/2005 |
| JP | 2008-534982 | 8/2008 |
| JP | 2009-511922 | 3/2009 |
| JP | 2009-198257 | 9/2009 |
| JP | 2010-054366 | 3/2010 |
| JP | 2010-107239 | 5/2010 |
| JP | 2011-035392 | 2/2011 |

* cited by examiner

LITHOGRAPHIC APPARATUS AND METHOD

CROSS REFERENCE TO RELATED APPLICATIONS

This application claims priority and benefit under 35 U.S.C. §119(e) to U.S. Provisional Patent Application Ser. No. 61/469,414, entitled "Lithographic Apparatus and Method", filed on Mar. 30, 2011, and to U.S. Provisional Patent Application Ser. No. 61/491,736, entitled "Lithographic Apparatus and Method", filed on May 31, 2011. The contents of those applications are incorporated herein in their entirety by reference.

FIELD

The present invention relates to a lithographic apparatus and a method to monitor and/or control deformations in an object of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The known lithographic apparatus comprises a position control system or controller to control the position of a substrate support supporting the substrate. This position control system comprises a position measurement system which is configured to measure a number of sensor or sensor target positions of the substrate support.

During use of the lithographic apparatus, forces will be exerted on the substrate support. For instance, during the expose phase, i.e. during projection of the patterned beam on a target portion of the substrate level, level actuations will be performed to position the upper surface of the substrate in a correct orientation with respect to the lens column. As the stiffness of the substrate support is limited, the level actuations may cause temporary deformations of the substrate support. Also, thermal conditions may result in deformations in the substrate support. These deformations may lead to focus errors and/or errors in overlay and CD uniformity To reduce the risk of deformations of the substrate table and as a consequence focus errors or overlay offset, it has been proposed to increase the stiffness of the substrate support by providing a stiffer structure. However, due to the increasing demand on accuracy and speed of the positioning of the substrate support, the possibilities to increase the structural stiffness of the substrate support structure without encountering further problems, for instance with respect to weight have come to their limits.

These limitations in flexibility of the substrate support as a result of increasing accelerations may also be encountered in the position control of other objects such as the patterning device support.

US 2011/0026004, the contents of which are herein incorporated by reference, discloses a lithographic apparatus comprising a stiffening system to increase the stiffness and/or to damp relative movements within the body of an object, the stiffening system comprising;

one or more sensors, wherein each sensor is arranged to determine a measurement signal representative for an internal strain or relative displacement in said body, one or more actuators, wherein each actuator is arranged to exert an actuation force on a part of said body, and at least one controller, configured to provide on the basis of said measurement signal of at least one of said sensors, an actuation signal to at least one of said actuators to control movements within said body, in particular to increase the stiffness and/or to damp movements within said body.

The sensors proposed in US 2011/0026004 are optical measurement sensors using laser interferometry, or, as an alternative, high performance strain gauges. By sensing of the shape of the object using laser interferometry, dynamic deformations within the object can be measured and counteracted resulting in a more stable shape of the object.

A drawback of the use of multiple interferometers in the object is that the resulting measurement system using laser interferometry is relative expensive and may be difficult to incorporate due to volume conflicts with other components.

SUMMARY

It is desirable to provide a lithographic apparatus a deformation sensor which uses low volume and is cost effective, or at least to provide an alternative deformation sensor.

According to an embodiment of the invention, there is provided a lithographic apparatus comprising:

a deformation sensor configured to determine a deformation of an object of the lithographic apparatus, wherein the deformation sensor comprises at least one optical fiber arranged on or in the object, the optical fiber comprising at least one Bragg grating, and an interrogation system configured to interrogate the at least one Bragg grating.

According to an embodiment of the invention, there is provided a method to monitor and/or control a deformation in an object of a lithographic apparatus, the method comprising:

determining a deformation of an object of the lithographic apparatus using a deformation sensor, wherein the deformation sensor comprises at least one optical fiber arranged on or in the object, the optical fiber comprising at least one Bragg grating, and an interrogation system to interrogate the at least one Bragg grating, and wherein the determining includes interrogating the at least one Bragg grating in the optical fiber.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
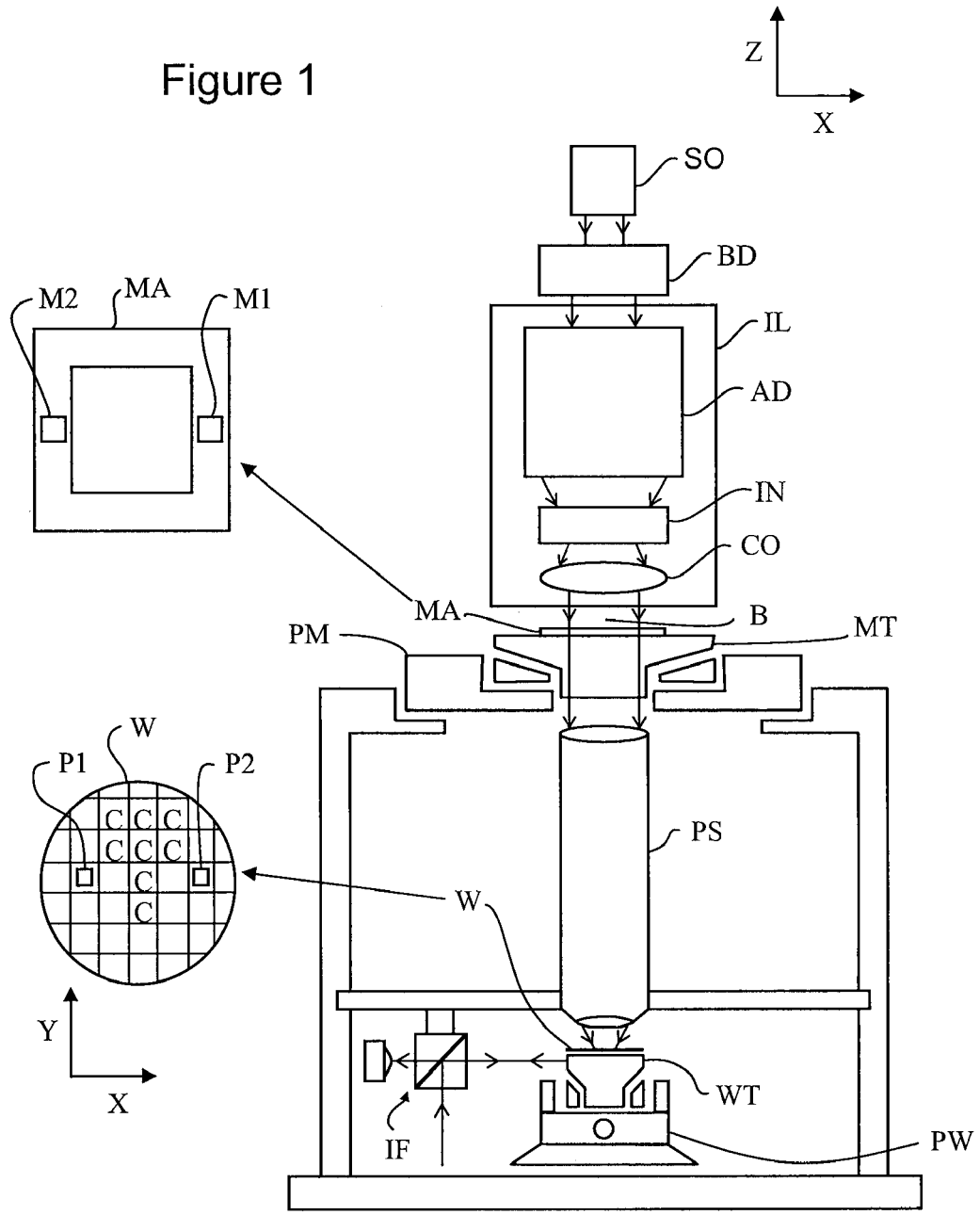
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small minors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
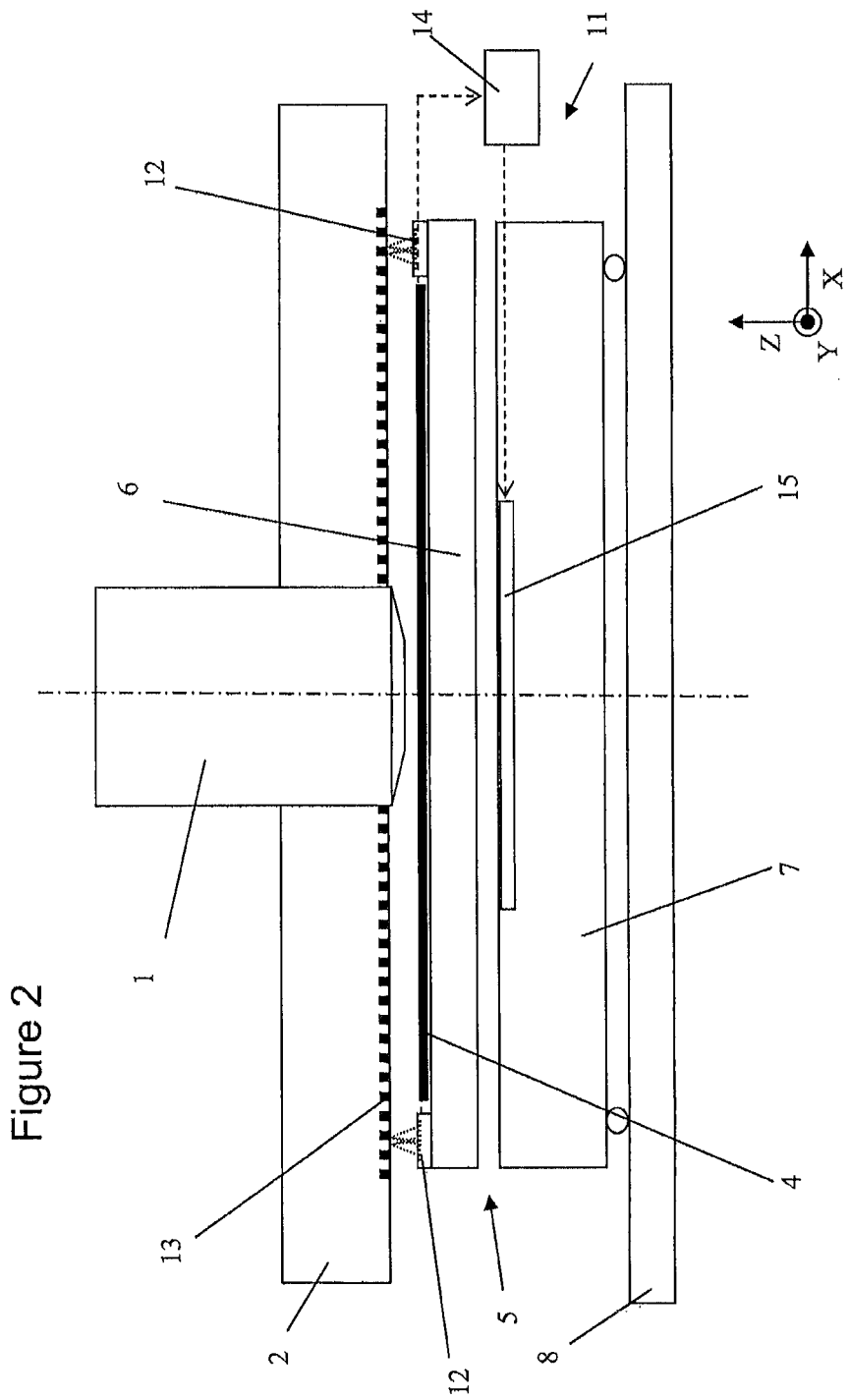
FIG. 2 depicts a prior art rigid body position control system for a substrate table.

FIG. 2 shows a part of a known lithographic apparatus in more detail. A projection system 1 is mounted on a metro frame 2. The projection system 1 is configured to project a patterned beam of radiation on a substrate 4 supported on a substrate support 5. The substrate support 5 comprises a substrate table 6, also referred to as short stroke stage, and a substrate table support 7, also referred to as long stroke stage, arranged to support the substrate table 6.

The substrate table support 7 is movably mounted on a base frame 8. The substrate table support 7 is movable with respect to the base frame 8 over a relative long range in at least two directions (X, Y). The substrate table 6 is in its turn movable with respect to the substrate table support 7 over a relative small range.

A position control system or position controller 11 is provided to align a target portion of the substrate 4 with respect to the projection system 1. The position control system comprises a substrate table position measurement system comprising encoder heads 12 mounted on the substrate table 6, and a grid or grating 13 arranged on the metro frame 2. In one embodiment, at least three encoder heads 12 are provided, each capable of measuring a position in two directions, therewith providing at least six degrees of freedom (DOF) position information of the substrate table 6. As an alternative for the position measurement system comprising multiple encoder heads 12, a laser interferometry system can be used.

The grid or grating 13 is for instance provided on a grid plate mounted on the metro frame 2. The position control system further comprises a controller 14 to provide an actuator signal to a substrate table actuator 15 arranged to position the substrate table 6 very accurately in a desired position, in one embodiment, in six degrees of freedom (DOF).

Since the substrate table 6 can only be moved over a relative small range with respect to the substrate table support 7, the position control system 11 actuates the substrate table support 7 to follow the movement of the substrate table 6 so that the required movement of the substrate table 7 remains within the relative small range of the movement of the substrate table 6 with respect to the substrate table support 7. In this small range the substrate table 6 can be controlled with high accuracy.

Each of the encoder heads 12 provides a measurement signal which is representative of a position or change in position of the encoder heads 12 with respect to the grid or grating 13. The controller comprises a subtractor in which the measured position is subtracted from a desired position signal generated by a set point generator. The resulting error signal is fed to a control device of the controller 14 which generates an actuation signal on the basis of the error signal. This actuation signal is fed to the substrate table actuator to move the actuator to the desired position. Feed-forward loops may be added in the control of the position of the substrate table 6 to further improve the accuracy and response time of the control system.

The above described position control system is known in the art. In the position control it is assumed that the substrate table behaves as a rigid body, having no internal deformations during acceleration of the body. However, with increasing demands on throughput and accuracy of the lithographic, the acceleration and deceleration of the substrate table 6 during positioning has to be increased. As a result, internal deformation of the substrate table 6 during movements, in particular acceleration and deceleration, play an increasing role in the accuracy of the positioning of a substrate table 6. Therefore, in the relevant frequency range, the substrate table 6 can no longer be regarded as a rigid body.

Figure 3:
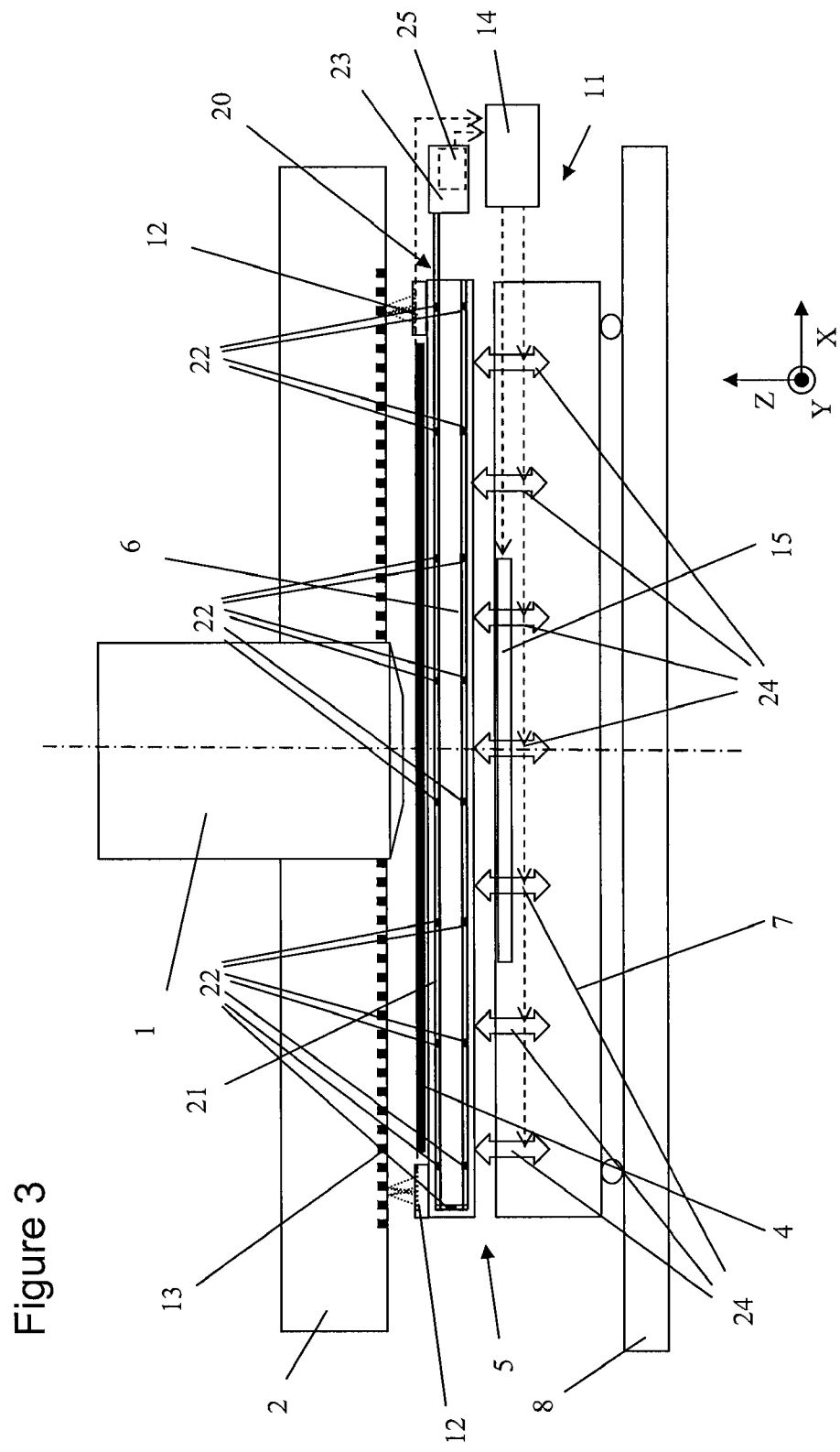
FIG. 3 depicts schematically a position control system for a substrate table according to an embodiment of the invention.

FIG. 3 shows an embodiment of the present invention comprising a position control system having a rigid body control system to control the position of the substrate table 6 with high accuracy, assuming it is a rigid body, and a deformation control system. The rigid body control system mainly uses the encoder heads 12, the grid or grating 13, the controller 14 and the actuator 15 configured to position the substrate table with respect to the projection system. This rigid body control system may function as described with respect to the prior art embodiment of FIG. 2.

In addition to the rigid body control system, the position control system of FIG. 3 comprises the deformation control system or deformation controller, which is configured to actively control deformations within the substrate table 6. The deformation control system comprises a deformation sensor or sensor 20 comprising an optical fiber 21 having multiple Bragg gratings 22 arranged at different locations within the substrate table 6, and an interrogation system 23.

The deformation control system further comprises a control unit or controller which is integrated in the controller 14, and a number of actuators 24. In an alternative embodiment, the control unit of the deformation control system may be provided as a separate control unit.

The actuators 24 may be of any suitable type, for instance Lorentz type actuators. The actuators 24 are divided over the surface of the substrate table 6, and arranged to exert a force on the substrate table 6 as indicated by the double-headed arrows representing the actuators 24. To provide sufficient locations for exerting an actuation force on the substrate table 6 multiple actuators 24, for instance ten to twenty, may be divided over the surface of the substrate table 6. However, in an embodiment it may also be possible to provide only one sensor and one actuator, for instance to counteract one specific internal deformation mode of the substrate table 6. The actuators 24 may be provided at any suitable location in or on the substrate table 6, between the substrate table 6 and another part of the substrate support, for example the long stroke part.

The optical fiber 21 is embedded in the substrate table 6, by arranging the optical fiber 21 in small grooves and filling the grooves with suitable material, such as a suitable resin. Any other method for embedding the optical fiber 21 in the substrate table 6 may also be used. As an alternative, the optical fiber 21 may be arranged on or in the substrate table 6 by any other suitable method.

A light source or radiation source, for instance integrated in the interrogation system 23 provides a broad band light (radiation) beam which is guided in the optical fiber 21. The optical fiber 21 comprises multiple Bragg gratings 22. Each Bragg grating 22 is configured to reflect a particular Bragg wavelength with a small variation dependent on the strain in the optical fiber 21 at the location of the respective Bragg grating 22. The reflected wavelength peaks are received by the interrogation system 23.

By giving each Bragg grating a different Bragg wavelength range, i.e. a specific Bragg wavelength and variations thereof due to strain, it can easily be detected in the interrogation system 23 from which Bragg grating, a particular reflected wavelength peak originates, and thus the location of that Bragg grating. It is remarked that time division multiplexing may be applied, to optimize use of the interrogation system. In such embodiment, Bragg gratings with the same wavelength range may be applied.

In the interrogation system 23 reflected wavelength peaks or other suitable properties of the reflected wavelength spectrum are analyzed to determine the exact wavelength of the reflected wavelength peak. The detection of the wavelength of the reflected peak may be based on peak detection algorithms, but is, in an embodiment, preferably based on the projection of the reflected light beam onto pixels of a CCD array after resolving the different wavelength by a diffraction grating. An example of a device for measuring change in wavelength using a CCD array is disclosed in US2003/0156287, the contents of which or herein incorporated by reference.

On the basis of the determined wavelengths and the associated strain for each Bragg grating, the deformation of the optical fiber 21 at the respective location in the substrate table 6 may be determined, since the optical fiber 21 is fixed within or on the substrate table 6.

The locations of the Bragg gratings 22 are selected such that the relevant deformations within the substrate table 6 can be observed with high accuracy. For example, the Bragg gratings are located to optimize observability of thermal and/or dynamic mode shapes, such as bend and torque mode shapes of the substrate table 6.

The determined strains at the different locations within the substrate table 6 may be used in the controller 14 to determine to which deformation modes the substrate table 6 is subject to, for instance, a torque and/or bend mode shape. These deformation mode shapes may be useful to calculate in the controller 14 the actuation forces to be exerted by the actuators 22 to counteract the deformations within the substrate table 6, as will be explained with reference to the control scheme of FIG. 4.

To obtain sufficient resolution in the measurement of the change in wavelength on the CCD array, or by any other detection method, different interrogation systems are proposed which make relative high resolution measurements possible. Embodiments of interrogation systems 23 with increased resolution will be described with reference to FIGS. 5, 6, 7 and 8.

It is remarked that as an alternative for determining the wavelength of a reflected peak, the wavelength of a dip in the transmitted broadband light beam may be determined from a light beam exiting the optical fiber 21 at the opposed end thereof.

A signal of the interrogation system 23 representative of the strains at the respective locations of the Bragg gratings 22 is calculated in or fed to the controller 14. The controller 14 provides actuation signals to one or more of the actuators 24 to exert a force on the substrate table 6, for example to counteract the deformations within the substrate table 6.

The control action of the deformation control system is in the present embodiment aimed at suppressing the deformations in the substrate table 6. As a result, the stiffness of the substrate table 6 may be increased and/or relative displacements within the substrate table 6 are substantially avoided.

Generally, the control action may be aimed at controlling deformations in the substrate table 6, and may for instance be aimed at increasing the stiffness of and/or damping of relative movements within the substrate table 6.

Figure 4:
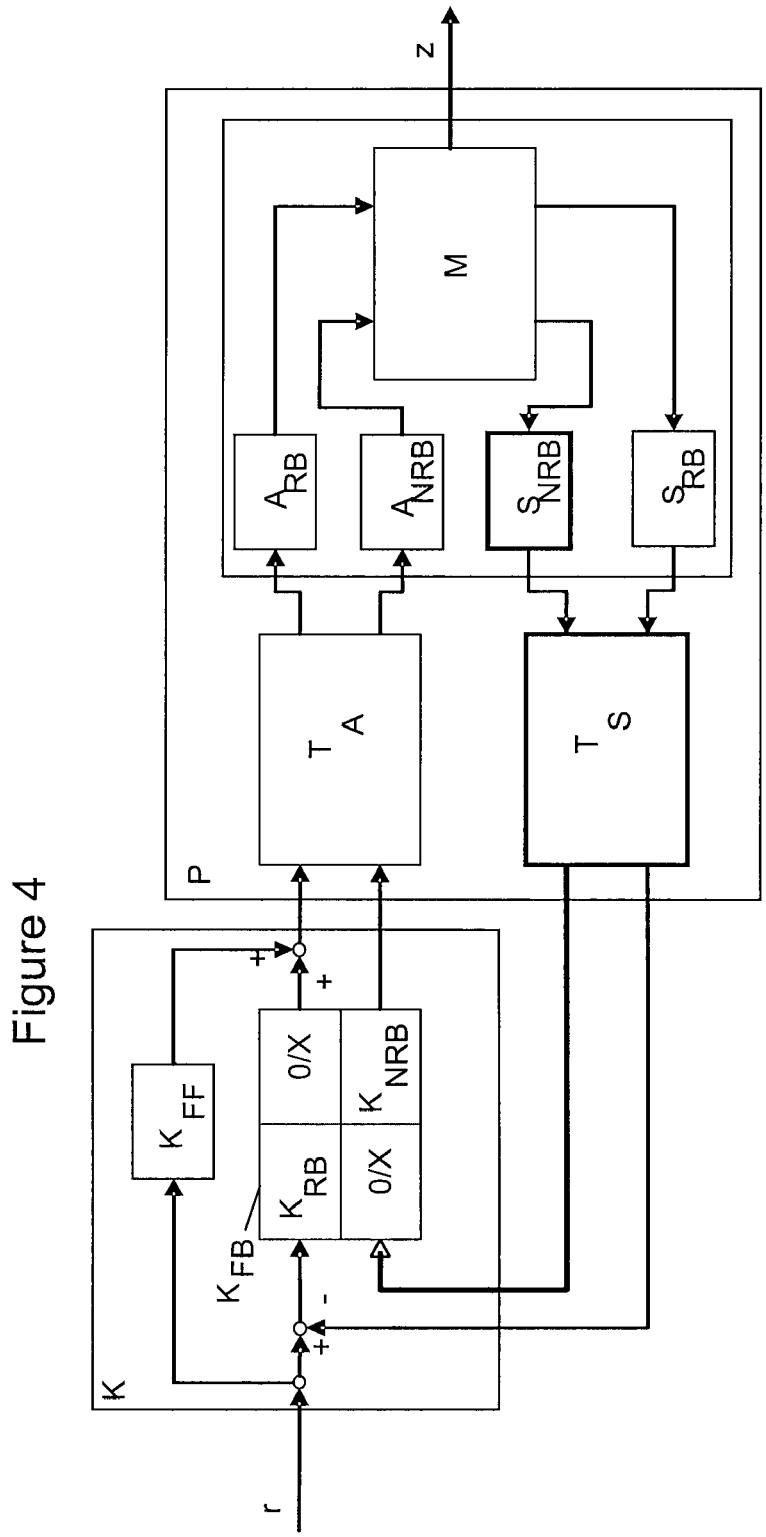
FIG. 4 depicts a control scheme for the position control system of FIG. 3.

FIG. 4 shows a control scheme showing a possible embodiment of a control system integrating the rigid body position control system and the deformation control system in a single position control system. The control system is configured to position a location of interest z, for example a target portion of a substrate held by the substrate table 6 in a set-point location r In this position control system, the system to be controlled is decoupled into the desired rigid body motion coordinates, typically x, y, Rz, z, Rx, Ry, and as a second step, SISO controllers are designed for these motion coordinates. In case the desired performance is not reached by applying this decentralized control strategy, cross-terms can be added to the controller resulting in a MIMO controller.

In the control scheme shown in FIG. 4, controller K comprises a feedback controller KFB and a feed forward controller KFF. These controllers control plant P that comprises the mechanics M of the substrate table 6, rigid body actuator ARB, (actuator 15), non-rigid body actuators ANRB (actuators 24), rigid body sensors SRB (encoder heads 12) and non-rigid body sensors SNRB (Bragg gratings 22).

The actuators and sensors are connected to the controller via an actuator transformation TA and sensor transformation TS that decouple the system into both rigid-body coordinates and additional non-rigid body coordinates in the frequency range of interest.

There are many control strategies that can be used for the non-rigid body control. To be able to retain the well-practiced decentralized control design approach for non-rigid body systems as well, modal control could be used, which is a natural extension of decentralized control used for rigid body control systems.

In this way, the rigid body and relevant dynamic and thermal non-rigid body mode shapes of the substrate table 6 each are isolated and nodal hardware co-ordinates are transferred via transformations TS into modal co-ordinates for the controller K.

The achievable decoupling accuracy, when measured as diagonal dominance of the decoupled system, is greatly influenced by the number and location of the actuators and sensors. With the deformation sensor or deformation sensor 20 of an embodiment of the present invention using an optical fiber 21 having multiple Bragg gratings 22 a highly flexible low volume measurement system can be arranged to locate the Bragg gratings 22 substantially at any suitable location within the substrate table 6. This highly flexible measurement system may thus substantially improve the decoupling accuracy of the position control system as shown in FIG. 4.

The provision of a deformation sensor 20 in a position control system of the substrate table may improve overlay and imaging performance by reduction of the stage positioning uncertainty via reduction of the measurement error between point of measurement and point of interest. Compared to the use of additional absolute sensors relative to the metrology frame or in-chuck laser interferometry as proposed in US 2011/0026004, the use of Bragg gratings provides a low-cost and very compact alternative for measuring both dynamic and thermal deformations in the substrate table 6, or any other object of interest in a lithographic apparatus. Other objects for which the Bragg gratings can be used comprise the patterning device support, the substrate table support 7, the metroframe 2 and the projection system 1.

The Bragg gratings may also be used to measure deformation of a grid plate, either connected to the metroframe 2, or to the substrate table 6 of substrate table support 7. This way, the dynamics of the grid plate becomes unobservable due to over-sensing. This means that dynamics of the grid plate no longer adversely affect the bandwidth of the controller controlling the stage.

A further benefit of the use of Bragg gratings in or on the object is that the deformation sensor can relatively easily be implemented and strain is directly measured independent of a reference body such as a long stroke actuator part or grid plate, which may deform as well.

As indicated above, the measurement signal obtained in the interrogation of the optical fiber 21 should be analyzed by the interrogation system 23 with sufficient resolution in order to be useful in high accuracy lithographic processes.

US2003/0156287, the contents of which are herein incorporated by reference, discloses a method for measuring strain in optical fibers comprising multiple Bragg gratings. In this method, each reflection of a Bragg grating is resolved by a diffraction grating and projected as a distinct spot onto pixels of a CCD array. Although this method provides the possibility to detect a change of the position of the spot with reasonable accuracy, the detection limit of wavelength variation of a silicon-based (low-cost) CCD interrogator is less than 1 pm, which corresponds to a measurement resolution of about 1µε.

To be able to resolve the different spots on the CCD array, a difference in wavelength of several nm is typically maintained between successive Bragg gratings. This is a trade-off between the number of sensors to be used, and the range of motion of the spots over the CCD array. Typically, a measurement range in the order of 5,000µε can be achieved for high-end systems using 100× interpolation through center of gravity detection over multiple pixels.

In US 2003/0156287, methods are described to further enhance sensitivity, in particular by dispersing the incoming light beam by more than one dispersive element. As a result, a larger separation between individual signals of individual Bragg gratings can be achieved. In US 2003/0156287 prisms or gratings are proposed to be used as dispersive elements. It is remarked that other optical elements, such as holographic elements could also be used.

A measurement resolution in the order of 1 µε may not be enough for what is required for metrology within a substrate table 6 of a lithographic apparatus. For dynamic and thermal structural deformation sensing in a substrate table 6, a measurement resolution in the order of a nm over typically 500 mm is required, i.e a few nε. A similar resolution may be required for dynamic mode shape monitoring and control thereof.

In an embodiment of the present invention, the interrogation system provides an enhanced resolution for the wavelength determination, for example by at least a factor 100, preferably 1000 in an embodiment, or even more. In this embodiment, it is proposed to use diffraction from dispersing elements in a first direction and a second direction, each of these in planes that are substantially perpendicular to each other. In an embodiment, the first direction and the second directions are preferably substantially perpendicular to each other.

Figure 5:
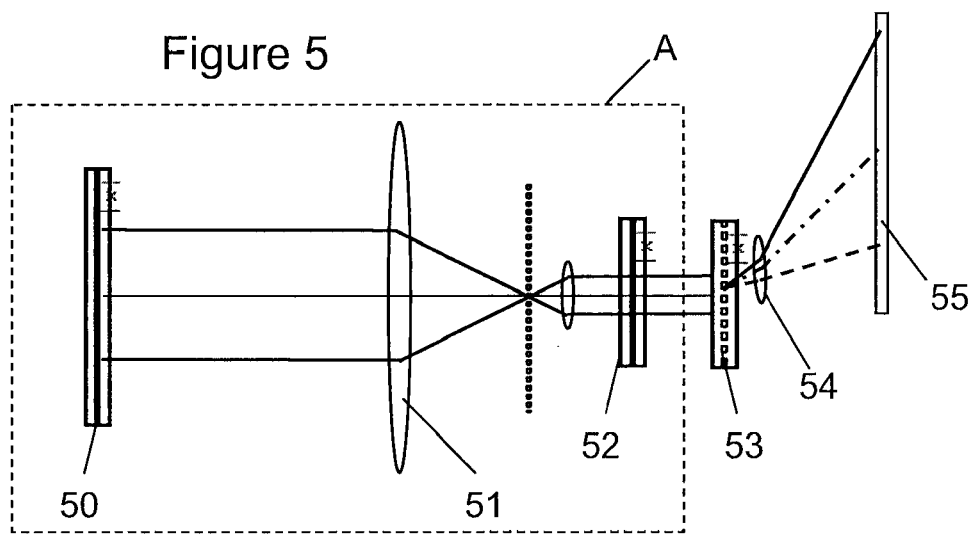
FIG. 5 depicts in top view schematically and partially an embodiment of an interrogation system according to the invention with enhanced resolution.
Figure 6:
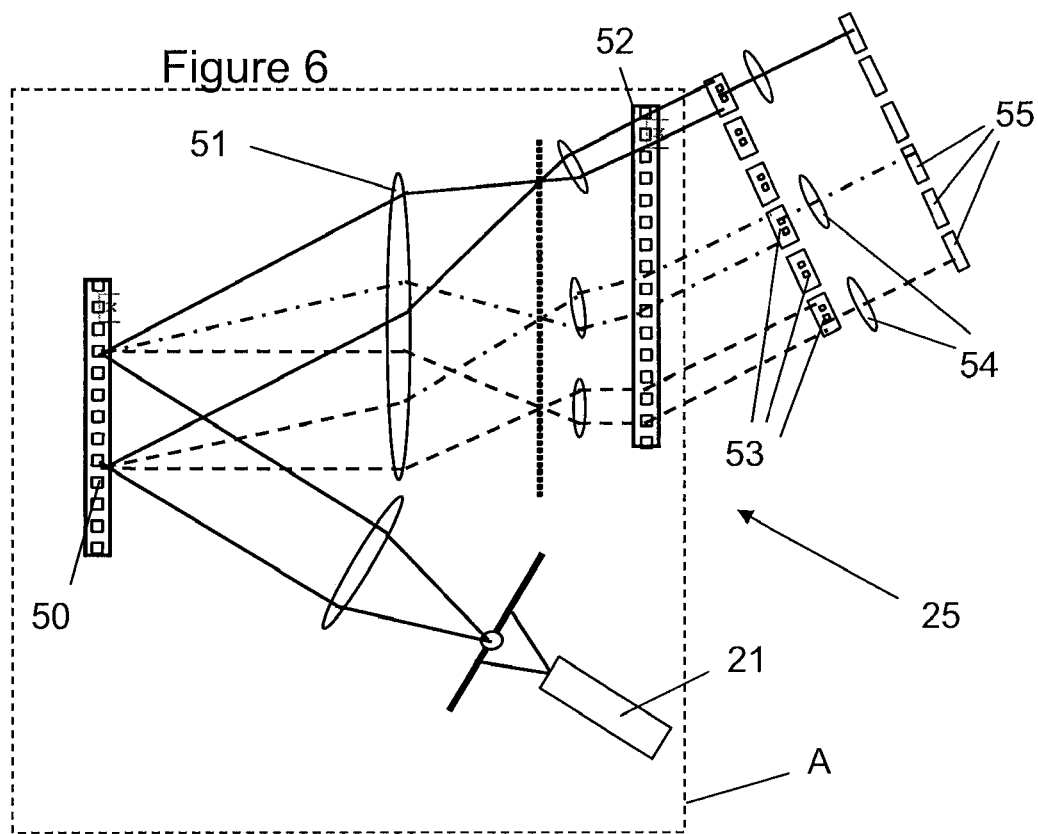
FIG. 6 depicts in side view the interrogation system of FIG. 5.

FIGS. 5 and 6 show an embodiment of an interrogation system 23 with further resolution enhancement using dispersing elements in a first vertical plane and a second plane substantially perpendicular to the first plane in top view and side view, respectively.

In an embodiment, the interrogation system comprises an entrance selector configured to receive and pass at least part of said light beam; a first diffractor arranged to receive at least part of said beam and to diffract in a first direction each of said signals at an angle dependent on said wavelength in a first plane of diffraction; and a second diffractor arranged to receive the diffracted signals and to diffract in a second direction each of said signals at an angle dependent on said wavelength in a second plane of diffraction, wherein said first plane of diffraction and second plane of diffraction are non-parallel to each other. The interrogation system further comprises a detector comprising a plurality of detector elements arranged to receive the diffracted signals of the second diffractor and to generate one or more detector output signals in dependence on the diffracted signals, and a processor connected to said detector to receive said detector output signals and determining the wavelength of each of said signals.

For example, referring to FIGS. 5 and 6, in the interrogation system 23, a first dispersive element 50 that comprises a horizontal grating diffracts light from the optical fiber 21 in the vertical plane in multiple parallel diffracted signals, each with a different Bragg wavelength. Via one or more collimator lenses 51 and a second dispersive element 52 with horizontal gratings, the different diffracted signals are fully 'unwrapped' and transformed into multiple aligned parallel beams.

These individual beams, are projected onto multiple individual dispersive elements 53, in an embodiment, preferably one for each diffracted signal associated with a single Bragg grating. The dispersive elements 53 have each a grating substantially perpendicular to the multiple aligned parallel beams that diffracts the different individual beams in plane that is essentially parallel to the individual beams and perpendicular to the vertical plane via a diverging lens element 54 onto multiple individual CCD arrays 55.

By diffraction of the light beam exiting from the optical fiber 21, in a first direction to provide multiple diffracted signals in the vertical plane, each associated with one or more specific Bragg gratings, and by subsequent diffraction of each of the diffracted signals in a second direction in a plane substantially perpendicular to the first vertical plane, the measurement beams are dispersed in three dimensions, resulting in a relative large surface area that is available for each individual diffracted signal being available for detection of the wavelength or wavelengths in the respective diffracted signal. This relative large surface area is beneficially used to increase the resolution of the interrogation system 23 without requiring relative large CCD array which may presently even not be available on the market. The resolution obtainable with this interrogation system may even approach or go beyond single digit nε.

It is remarked that the diffractive vertical gratings may all have different pitch, whereby the pitch is adapted to the particular Bragg wavelength λ, such that the refracted range of angles α=arcsin(λ/p) and therefore resolution for all Bragg gratings is similar.

In FIGS. 5 and 6 for each beam a single linear CCD array is proposed. In an alternative embodiment, this set of individual linear CCD arrays may be combined in a 2D CCD array.

Figure 7:
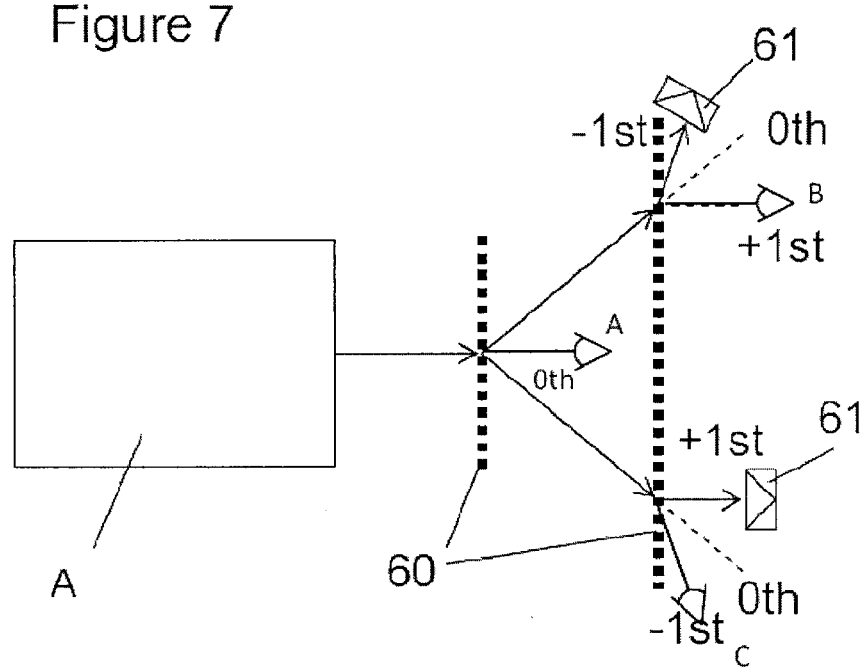
FIG. 7 depicts in top view schematically and partially an alternative embodiment of an interrogation system according to the invention with enhanced resolution.
Figure 8:
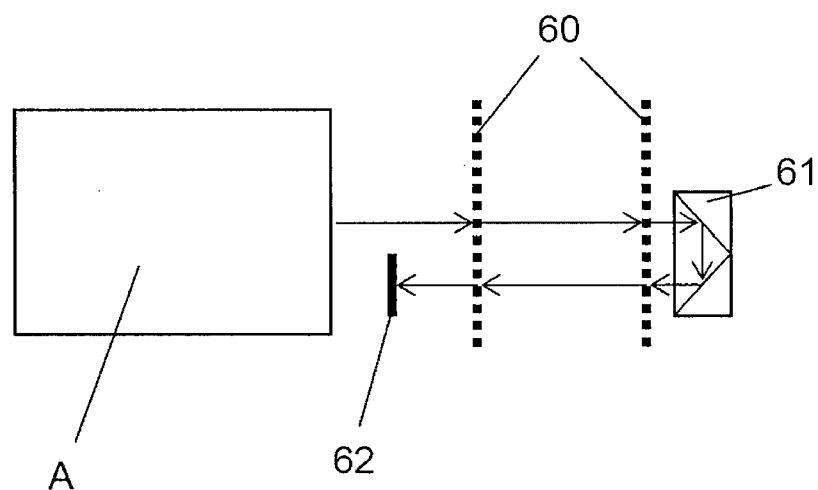
FIG. 8 depicts in side view the interrogation system of FIG. 7.

FIGS. 7 and 8 show a second embodiment of interrogation system 23 with enhanced resolution in top view and side view, respectively. In this embodiment use is made of interferometry between +1st and −1st refracted orders of a reflected light beam with a particular wavelength of the optical fiber 21.

Before the +1st and −1st refracted orders of the respective light beam are created, the light beam exiting from the optical fiber 21 may be diffracted in the plane substantially perpendicular to the plane of diffraction as shown in FIG. 7 to obtain diffracted signals for each Bragg wavelength range. To obtain these diffracted signals the interrogation system 23 may be configured as shown in box A of FIGS. 5 and 6. By creating individual signals for each of the relevant wavelength range interference among beams with a different Bragg wavelength may be avoided. Any other suitable beam splitting device to split the light beam in multiple light beams, each having a particular relevant wavelength range, may also be used.

The diffracted signals are again diffracted by gratings 60 to obtain the +1st and −1st refracted orders of the respective light beam from box A. The +1st and −1st refracted orders are each guided via retro-reflectors 61 to its own detector element 62, for instance a photo diode. By measuring the change in intensity of the light received by each of the detection elements 62, the specific wavelength of the light beam may be determined.

Since the state of the art interpolation factor of photo diodes is in the order of 5000 X, which is substantially larger than the 100 X achievable interpolation for a CCD array, resolution can be further enhanced, even down to the order of 10 pε for a measurement range of about 10 με.

It is remarked that any suitable combination of first orders may be used, for example also the first order of a single branch, e.g. the +1st and the −1st order of the first branch.

As the intensity of the light beam may vary, the measurement certainty may be endangered. To prevent this, a redundant order may be measured as a reference for the intensity. For example, in FIG. 7, the redundant order may be a $0^{th}$ order at point A, or a $1^{st}$ order at point B, or a $-1^{st}$ order at point C. The redundant order may be any order that is not needed for the measurement.

Hereinabove, a deformation control system is described to control deformations within an object. The deformation control system according to an embodiment of the invention may be used to counteract deformations during accelerations or decelerations, but also to counteract deformations due to other causes, such as temperature differences between different parts of the substrate table or external forces exerted on the substrate table, for instance forces exerted by an immersion system of the lithographic apparatus.

Figure 9:
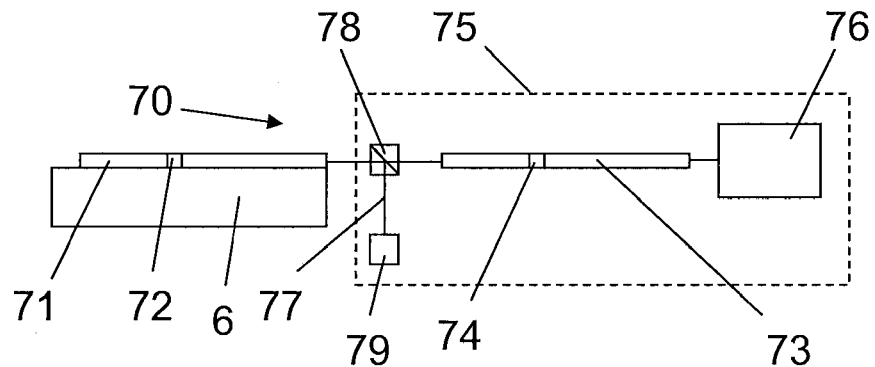
FIG. 9 depicts a first alternative embodiment of a deformation sensor according to the invention.

FIG. 9 shows schematically an embodiment of an alternative deformation sensor 70. The deformation sensor 70 comprises a first optical fiber 71 comprising a first Bragg grating 72 and a second optical fiber 73 comprising a second Bragg grating 74. The first Bragg grating 72 and the second Bragg grating 74 have substantially the same Bragg wavelength range. The first optical fiber 71 is arranged on or in a substrate table 6. The second optical fiber 73 is part of an interrogation system 75.

In alternative embodiments the second optical fiber 73 may also be arranged on the object of which deformations should be detected, in this case the substrate table 6, or at any other suitable location. The second Bragg grating 74 in the second optical fiber 73 is arranged, in an embodiment, on the substrate table 6 at a location wherein the effects of a mode shape are opposite to the effects on the first Bragg grating 72. For example, to determine a bending mode shape of the substrate table 6, the first Bragg grating 72 may be arranged on a top side of the substrate table 6 and the second Bragg grating 74 may be arranged on the down side of the substrate table 6.

A broad-band light source 76 having a spectrum with at least the frequencies of the Bragg wavelength range of the first Bragg grating 72 and the second Bragg grating 74 is arranged to emit light into the second optical fiber 73. The second Bragg grating 74 will reflect a particular Bragg wavelength peak and the rest of the spectrum of the broad-band light source will be transmitted through the second optical fiber 73. The transmitted spectrum will be guided to the first optical fiber 73. The first Bragg grating 72 in the first optical fiber 71 will also reflect a particular Bragg wavelength peak dependent on the strain to which the first optical fiber 71 at the location of the first Bragg grating 72 is subject. This reflected light beam is used as measurement beam 77 and is guided via a semi-transparent mirror 78 and/or one or more other suitable optical element to a photo sensor 79 capable of measuring the intensity of the measurement beam 77, for example a photo diode.

When it is assumed that other influences on the wavelength peak reflected by the Bragg grating are not present and that no strain or the same strain is exerted on both Bragg gratings 72, 74, the first Bragg grating 72 already reflects the wavelength peak which would be reflected by the second Bragg grating 74, since Bragg wavelengths of the first Bragg grating 72 and second Bragg grating 74 are the same. As a result, the measurement beam 77 will have a very low intensity, which will be determined by the photo sensor 79.

When there is a difference in the strain exerted on the first Bragg grating 72 and the second Bragg grating 74, the wavelength peak reflected by the first Bragg grating 72 and the wavelength peak reflected by the second Bragg grating 74 will be different. Thus the wavelength peak reflected by the first Bragg grating 72 will be partly present in the transmitted spectrum of the second Bragg grating 74. As a result, the measurement beam 77 will have a larger intensity, due to the non-overlapping part of the two wavelength peaks, which can be determined by the photo sensor 79.

The wavelength peak which will be reflected by a Bragg grating will not be a perfect discrete peak, but will be a peak that extends over a certain wavelength range. In the nominal position, i.e. no strain or the same strain, the peak reflected by the first Bragg grating 72 and the second Bragg grating 74 will completely overlap and the intensity of the measurement signal 77 will be very low. With increasing differences in the strain between the first Bragg grating 72 and second Bragg grating 74, the intensity of the measurement beam 77 will also increase since the peaks will less and less overlap until there is completely no overlap between the two peaks.

Figure 10:
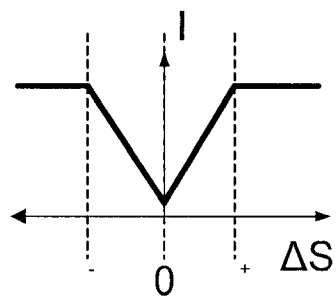
FIG. 10 depicts a relationship between intensity of a measurement beam and the difference in strain between a first and second Bragg grating in the deformation sensor of FIG. 9.

FIG. 10 shows the resulting relationship between the intensity I of the measurement signal 77 and the difference in strain ΔS. In the nominal position 0, the intensity is relatively low. With increasing difference in strain starting from the nominal position 0 the intensity increases until a maximum intensity level is reached. The slopes in this relationship may be used to measure the difference in strain between the first Bragg grating 72 and the second Bragg grating 74. It has been found that this relationship makes a determination of the strain with very high resolution possible, while at the same time the required electronics, a photo sensor, is relative simple.

The resolution of the measurement with the deformation sensor 70 is limited by the noise level of the selected photo sensor 79, for example a photo diode. A signal-to-noise ratio (SNR) of a photodiode may for instance be SNR=85 dB.

The strain is related to the wavelength shift and therefore to signal intensity, i.e., $$\varepsilon = \frac{\Delta L}{L_0} = \frac{\Delta \lambda}{\lambda_0} = kI,$$

where L0 is the nominal length, ΔL is the length variation, λ0 is the nominal reflected wavelength peak, Δλ is the wavelength variation, k is a constant, and I is the received signal intensity of the second measurement beam 77.

To derive the resolution that can be obtained, the reflected wavelength band of the FBG is of importance. This wavelength band can be as small as Bλ=0.3 nm for a nominal wavelength of 1500 nm. Therefore, maximum signal intensity is reached at a strain of:

$$\varepsilon_{max} = \frac{B_\lambda}{\lambda_0} = \frac{0.3}{1500} = 200 \ \mu m/m$$

The corresponding resolution of this system is therefore $$\varepsilon_{res} = \frac{\varepsilon_{max}}{SNR} = 11 \ nm/m$$

Since the first Bragg gating 72 and the second Bragg grating 74 may not be perfectly the same, and other factors may influence the behavior of the Bragg gratings, the deformation sensor 70 may have to be calibrated before use. It is remarked that other influences such as temperature may have an effect on the wavelength peak reflected by the Bragg grating. These influences should be taken into account, or may be filtered when both Bragg gratings experience similar influences, such as temperature. This is possible since the measurements are relative measurements.

Figure 11:
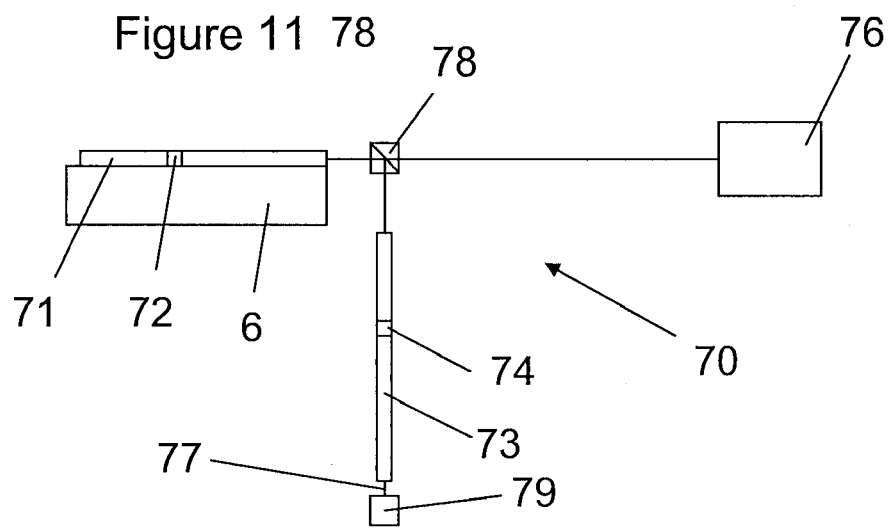
FIG. 11 depicts a second alternative embodiment of a deformation sensor according to the invention.
Figure 12:
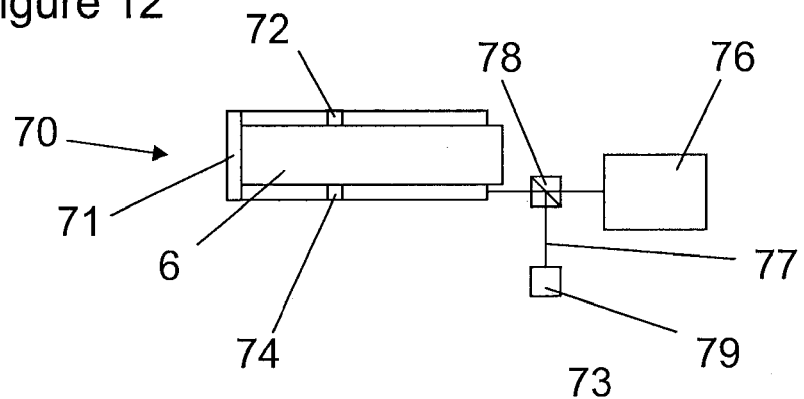
FIG. 12 depicts a third alternative embodiment of a deformation sensor according to the invention.

FIGS. 11 and 12 show alternative embodiments of a deformation sensor 70 using a first Bragg grating 72 and a second Bragg grating 74 having substantially the same Bragg wavelength range. The interrogation system comprises at least one photo sensor 79 to measure an intensity of a measurement beam 77 resulting of reflection of the first Bragg grating 72 and transmission of the second Bragg grating 74. It is remarked that the first and second Bragg gratings 72, 74, may have a nominal offset from each other, introducing for example a larger tension range at the cost of the compression range, or vice versa.

In the embodiment of FIG. 11, the broad-band light beam of the light source 76 is first guided into the first optical fiber 71 and only a particular wavelength peak is reflected by the first Bragg grating 72. The reflected wavelength peak is guided through the second optical fiber where a particular wavelength peak is reflected by the second Bragg grating 74. The spectrum transmitted by the second Bragg grating 74 will be guided to the photo sensor 79 which will measure the intensity of the measurement beam 77 transmitted by the second optical fiber 74.

In the nominal position the wavelength peaks reflected by the first Bragg grating 72 and second Bragg grating 74 will be substantially the same. Since the measurement beam 77 combines the reflection of the first Bragg grating 72 and the transmission of the second Bragg grating 74, the intensity the intensity of the measurement beam 77 will, in this nominal position, be very low. When there is a difference in strain the wavelength peaks will not completely overlap and the intensity of the measurement beam will be larger.

In the embodiment of FIG. 12, the first Bragg grating 72 and second Bragg grating 74 are also arranged in series, wherein the photo sensor 79 measures the intensity of the reflection of the first Bragg grating 72 and the transmission of the second Bragg grating 74. A difference between the embodiment of FIG. 9 and the embodiment of FIG. 12 is that the first Bragg grating 72 and the second Bragg grating 74 may both be arranged in the first optical fiber 71 which is arranged on the substrate table 6. However, when desired the first and second Bragg gratings may also be arranged in separate optical fibers.

Since the first Bragg grating 72 and the second Bragg grating 74 are arranged at opposite sides of the substrate table 6, the arrangement is suitable to determine bend mode shapes of the substrate table 6. Bending of the substrate table 6 will result in compression on one side of the substrate table 6 and stretching of the other side of the substrate table 6. This increases the sensitivity of the deformation sensor 70. However, similar to other embodiments, also only one of the Bragg gratings may be arranged on the substrate table 6.

Another difference between the embodiment of FIG. 9 and the embodiment of FIG. 12 is that in the embodiment of FIG. 12 the measurement beam 77 does not only comprise the wavelength peak transmitted by the second Bragg grating 74 and reflected by the first Bragg grating 72, but also the wavelength peak of the second Bragg grating 74 which is directly reflected. As a result, the minimum intensity measured by the photo sensor 79 is the intensity of the wavelength peak directly reflected by the second Bragg grating 74. When there is no strain difference no further light will be reflected by the first Bragg grating 72, since this wavelength peak is already reflected by the second Bragg grating 74. When there is a difference in strain, the second Bragg grating 74 will reflect the second wavelength peak and the first Bragg grating 72 will reflect a part of a first wave length peak which is non-overlapping with the second wavelength peak reflected by the second Bragg grating. As a result, the intensity received by the photo sensor 79 may increase with increasing difference in strain as explained with respect to FIG. 10, until the first and second wavelength peaks do not longer overlap.

It is remarked that the configuration of FIG. 12 may provide two measurement regimes since the measurement beam 77 received by the photo sensor 79 comprises a combination of a reflection of the first Bragg grating 72 and transmission of the second Bragg grating 74, but also a combination of reflections of the first Bragg grating 72 and the second Bragg grating 74.

In a first regime, overlap between the first and second wavelength peaks is used as discussed above with respect to FIGS. 9 and 11. In this first regime range and resolution may correspond to the embodiments of FIGS. 9 and 11. In a second regime interference between first and second wavelength peaks reflected by the first Bragg grating 72 and second Bragg grating 74 is used. This second regime may in particular be used when the first and second wave length peaks do not overlap. In this second regime a method using beat frequency as explained hereinafter with respect to the embodiment of FIG. 14 may be used. The combination of a first and second regime makes it possible to have two measurement ranges. For example, a smaller measurement range with higher resolution may be used around a nominal point of interest, and a larger measurement range with lower resolution may be used at locations at larger distances from the nominal point of interest, i.e. outside the smaller measurement range. In such configuration, the first regime may be used for the smaller measurement range, while the second regime is used for the larger measurement range.

In the first regime, again the difference between the minimum intensity and the maximum intensity is the intensity of a wavelength peak reflected by a Bragg grating, wherein the intensity level is the lowest when there is no strain or when the strain is the same in the first Bragg grating 72 and second Bragg grating 74, as shown in FIG. 10.

In practice, it is desirable to measure strain at multiple locations, but it may not be practical to provide one or two optical fibers for each combination of a first Bragg grating and a second Bragg grating. In such case multiple combinations of first and second Bragg gratings may be provided in one or more optical fibers, wherein the first and second Bragg grating of each combination have substantially the same Bragg wavelength range, but each combination has another Bragg wavelength range than other combinations.

Figure 13:
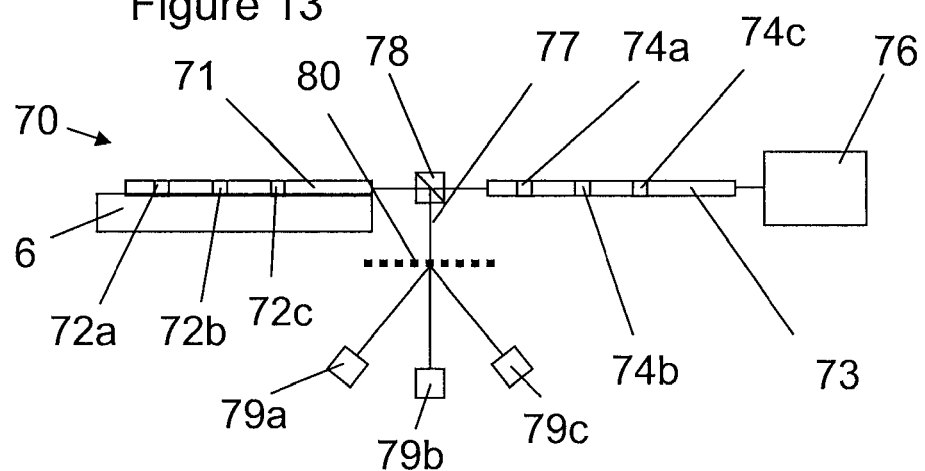
FIG. 13 depicts a fourth alternative embodiment of a deformation sensor according to the invention.

Such configuration is shown in FIG. 13. The set-up of the deformation sensor 70 is mainly the same as the embodiment of FIG. 9, only the first optical fiber 71 comprises three first Bragg gratings 72a, 72b, 72c, and the second optical fiber 73 comprises three second Bragg gratings 74a, 74b, 74c. The pairs 72a and 74a, 72b and 74b, and 72c and 74c each form a combination of a first and second Brag grating having substantially the same Bragg wavelength range. For example the Bragg gratings 72a and 74a have the same wavelength range. But the wavelength ranges of the different combinations do not have the same wave length range. Thus, the wavelength ranges of Bragg gratings 72a, 72b and 72c are not the same.

When the photo sensor can only measure intensity, such as a photo diode or other photo sensor measuring light intensity, there is no differentiation by the sensor between the different wavelength ranges in the determination of the intensity. By providing a dispersive element 80, the different wavelength ranges can be directed to associated photo sensors 79a, 79b, 79c, and for each of the wavelength ranges the reflected intensity can be separately determined.

Any other suitable way of determining the intensity of the different wavelength ranges may also be applied. For example, different wavelength ranges each comprising only one Bragg wavelength range may subsequently be transmitted by the light source so that for each time period wherein one of such wavelength ranges is emitted by the light source it is known which combination of first and second Bragg grating are associated with the intensity received by a single photo sensor.

Figure 14:
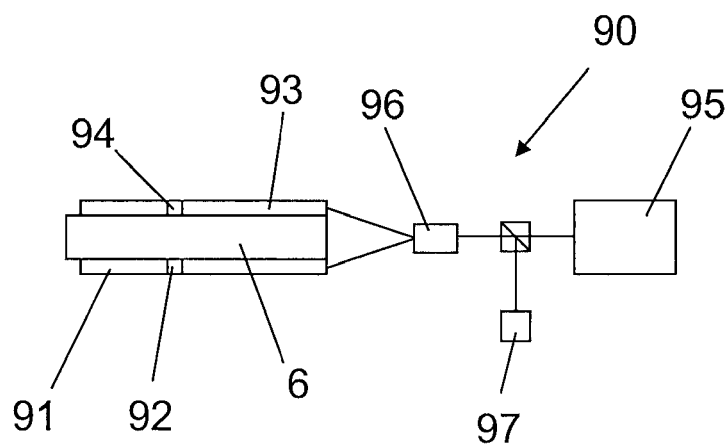
FIG. 14 depicts a fifth alternative embodiment of a deformation sensor according to the invention.

FIG. 14 shows a further alternative embodiment of a deformation sensor 90 according to an embodiment of the invention. In this deformation sensor 90, a first optical fiber 91 comprising a first Bragg grating 92 and a second optical fiber 93 comprising a second Bragg grating 74 are arranged in parallel. The first Bragg grating 92 and the second Bragg grating 74 have substantially the same Bragg wavelength range.

A broad-band light source 95 having a spectrum with at least the frequencies of the Bragg wavelength range of the first Bragg grating 92 and the second Bragg grating 94 is arranged to emit a light beam which is split by beam splitter 96 into a first beam into the first optical fiber 91 and a second beam into the second optical fiber 93. The first Bragg grating 92 and second Bragg grating 94 will reflect a particular Bragg wavelength peak and the rest of the spectrum of the broadband light source will be transmitted through the first optical fiber 91 and second optical fiber 93, respectively.

The reflected wavelength peaks of the first Bragg grating 92 and the second Bragg grating 94 are brought back together and guided to a photo sensor 97 via one or more optical elements. The photo sensor 97 is a sensor capable of measuring light intensity, for example a photo diode. Interference between the reflected wavelength peaks of the first Bragg grating 92 and the second Bragg grating 94 may be used to determine the strain to which the first Bragg grating 92 and/or second Bragg grating 94 is subject to.

The two reflected wavelength peaks coming into the photo sensor will have substantially the same amplitude but slightly different wavelengths as a result of a strain difference. This will result in a beat signal which is received by the photo sensor 97. The wavelength of the beat pattern may be defined as $$\lambda_B = \frac{\lambda_1 \lambda_2}{(\lambda_2 - \lambda_1)},$$

wherein $\lambda_B$ is the beat frequency, $\lambda_1$ the frequency reflected by the first Bragg grating and $\lambda_2$ the frequency reflected by the second Bragg grating.

When it is assumed that the difference between the two reflected wavelength peaks is small, which is the case as the Bragg grating have substantially the same Bragg wavelength range, this equation can be rewritten as $$\because \lambda_1 \approx \lambda_2$$
$$\therefore \lambda_B = \frac{\lambda_1 \lambda_2}{(\lambda_2 - \lambda_1)} \approx \frac{\lambda_n^2}{\Delta\lambda}$$

Strain can be defined as $$\varepsilon = \frac{\Delta\lambda}{\lambda_n}$$

And the combination of the latter two equations results in $$\lambda_B = \frac{\lambda_n}{\varepsilon}$$

Therefore, the strain can be measured by measuring the beat frequency of the received signal. For example, this measurement can be realized through a phased-locked loop circuit. Since this photo sensor relies on measuring a differential signal, absolute accuracy of the photo sensor may be less important. It is remarked that the beat-frequency may also be used for real-time auto-calibration of the deformation sensor.

To determine the resolution, assuming that the photo sensor is updated with 20 kHz bandwidth and within such period there has to be at least one beat-frequency period to be received. The associated minimum strain that can be detected is $$\varepsilon_{min} = \frac{\lambda_n}{\lambda_{B,max}}$$

where $\lambda_{B,max}$ is the maximum beat wavelength, i.e., $$\lambda_{B,max} = \frac{c}{f_{min}},$$

with c=3.0e8 m/s (speed of light) and $f_{min}$=20 kHz (minimum sensor bandwidth). Therefore $$\varepsilon_{min} = \frac{\lambda_n f_{min}}{c}.$$

Using $\lambda_n$=1500 nm, $f_{min}$=20 kHz, and c=3.0e8 m/s results in $\lambda_{min}$=0.10 nm/m.

Commercially available high-speed photodiodes have a cut-off frequency in the range of several GHz. Assume that a beat frequency up to 50 MHz can be measured. The associated maximum strain is $$\varepsilon_{max} = \frac{\lambda_n f_{max}}{c},$$

using $\lambda_n$=1500 nm, $f_{max}$=50 MHz, and c=3.0e8 m/s results in $\lambda_{max}$=250 nm/m.

Thus, the resolution obtainable with embodiment of FIG. 14 is at least comparable with the resolution with enhanced resolution embodiments of FIGS. 5-8. Therefore, the embodiment of FIG. 14 provides a suitable alternative with simple construction and high resolution.

Similar to the embodiment of FIG. 12, when desired, multiple combinations of first and second Bragg gratings may be provided in two optical fibers to measure strain at different locations in a substrate table 6 or other object.

In the embodiment of FIG. 14 both the first optical fiber 91 having the first Bragg grating 92, and the second optical fiber 93 having the second Bragg grating 94 are arranged on the substrate table 6. In an alternative embodiment, only one of the first optical fiber 91 and the second optical fiber 93 may be arranged on the substrate table 6, and the other of the first optical fiber 91 and the second optical fiber 93 may be arranged on another suitable location, for instance in the interrogation system.

All the embodiments shown in FIGS. 9-14 comprise only one photo sensor for each wavelength range associated with one combination of first and second Bragg gratings. This results in a relative simple design with a relative low number of optical components and a high resolution. This high resolution is at least comparable to the embodiments shown in FIGS. 5-8, but can even be higher. Furthermore, the embodiments of FIGS. 9-14 have fast signal output. The limiting factor is the read-out electronics of the photo sensor.

Hereinabove an interrogation system comprising further resolution enhancement using dispersing elements in a first vertical plane and a second plane non-parallel to the first plane is described in relation to a lithographic apparatus. It is however remarked that the use of such interrogation system with further resolution enhancement is not restricted to a lithographic apparatus; such interrogation system but may be used in any other suitable application and/or measurement system.

Figure 15:
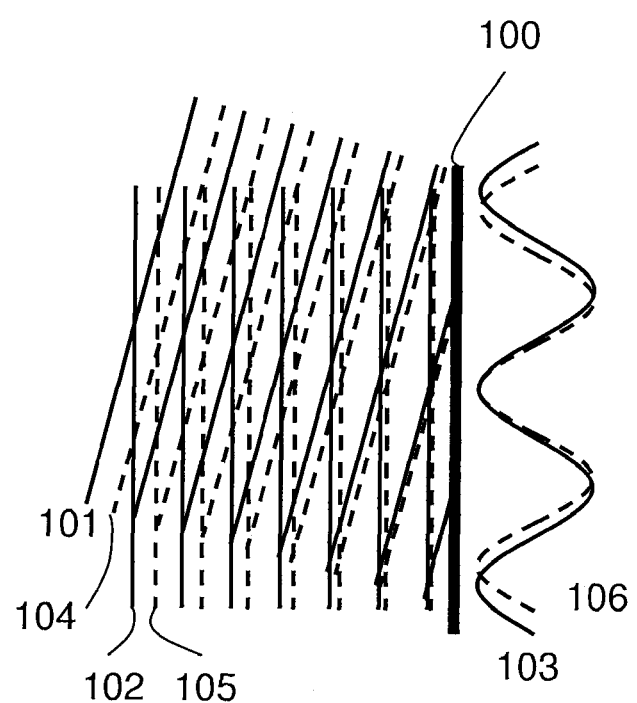
FIG. 15 depicts a sixth alternative embodiment of a deformation sensor according to the invention.

In the embodiments above, the light beam returning to the detector may be split after the fiber into two beams 101, 102, see FIG. 15. The two beams are angled with respect to each other. The waves of these two beams are schematically represented by the lines parallel to 101 and 102. When the two beams 101 and 102 interfere on CCD 100, an interference pattern 103 is created. The width of this pattern 103 can be determined with the CCD 100, and is a measure of the returning wavelength. Hence it is a measure of the strain of the Bragg grating. When the two beams 102 and 105 are split from a returning light beam with a smaller wavelength, the resulting interference pattern 106 has a smaller width.

It is further remarked that the optical components described above may be separate components, or may be combined or integrated components.

It is further remarked that the deformation sensors of FIGS. 9-14 may also be used in other applications than a lithographic apparatus.

Hereinabove the use of a deformation sensor comprising at least one optical fiber with multiple Bragg gratings in a position control system has been described. In practice, the deformation sensor may also be used for alternative applications in a lithographic apparatus. The deformation sensor may be used to monitor the shape of an object, such as the support for a substrate or patterning device, but also the projection system. The deformation sensor may also be part of a control system to only control the shape of the object, for instance to maintain a desired shape and/or to stiffen or dampen the object by active control. The deformation sensor may also be used for any other application wherein it is desirable to monitor and/or control the deformations within an object of the lithographic apparatus, or any other device.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a deformation sensor configured to determine a deformation of an object of the lithographic apparatus, wherein the deformation sensor comprises at least one optical fiber arranged on or in the object, the optical fiber comprising at least one Bragg grating, and an interrogation system configured to interrogate the at least one Bragg grating, wherein the interrogation system is configured to analyze a light beam comprising one or more signals each with its own wavelength, and comprises:
   an entrance selector configured to receive and pass at least part of said light beam;
   a first diffractor arranged to receive at least part of said beam and to diffract in a first direction each of said signals at an angle dependent on said wavelength in a first plane of diffraction; and
   a second diffractor arranged to receive the diffracted signals and to diffract in a second direction each of said signals at an angle dependent on said wavelength in a second plane of diffraction, wherein said first plane of diffraction and second plane of diffraction are non-parallel to each other,
   a detector comprising a plurality of detector elements arranged to receive the diffracted signals of the second diffractor and to generate one or more detector output signals in dependence on the diffracted signals, and
   a processor connected to said detector to receive said detector output signals and determining the wavelength of each of said signals.

2. The lithographic apparatus of claim 1, comprising a processor configured to determine a shape of the object on the basis of a signal of the interrogation system.

3. The lithographic apparatus of claim 1, comprising a deformation control system configured to control a deformation within the object, wherein said deformation control system comprises the deformation sensor, a controller and at least one actuator within the object, wherein the controller is configured to actuate the at least one actuator on the basis of the deformation measured by the deformation sensor.

4. The lithographic apparatus of claim 3, wherein the deformation control system is configured to maintain the object in a predefined shape and/or actuate to a desired shape.

5. The lithographic apparatus of claim 4, wherein the position control system is a MIMO control system configured to simultaneously control position of and deformations within the object.

6. The lithographic apparatus of claim 4, wherein the position control system is configured to control the object on the basis of position control of a rigid body and suppression of change in any non-rigid body mode shapes.

7. The lithographic apparatus of claim 3, wherein the object is movable, and wherein the deformation control system is part of a position control system of the lithographic apparatus, wherein the position control system is configured to control a position of the movable object.

8. The lithographic apparatus of claim 1, wherein the Bragg gratings are arranged to optimize observability of thermal and/or dynamic mode shapes of the object.

9. The lithographic apparatus of claim 1, wherein the object is provided with grooves, in which the optical fiber is at least partially arranged, wherein the grooves further are filled with a resin.

10. The lithographic apparatus of claim 1,
wherein the second diffractor is used to create a $+1^{st}$ order and a $-1^{st}$ order of at least one of the diffracted signals and wherein the detector elements are arranged to receive the $+1^{st}$ order and a $-1^{st}$ order of one of the diffracted signals to determine a wavelength of one of the one or more signals on the basis of interferometry between the $+1^{st}$ order and a $-1^{st}$ order of the respective one of the diffracted signals, wherein said first plane of diffraction and second plane of diffraction are substantially perpendicular to each other.

11. The lithographic apparatus of claim 1, wherein the first plane of diffraction and the second plane of diffraction are substantially perpendicular to each other.

12. The lithographic apparatus of claim 1, wherein the deformation sensor comprises a first Bragg grating and a second Bragg grating having substantially the same Bragg wavelength range, and wherein the interrogation system comprises at least one photo sensor to measure an intensity of a measurement light beam resulting of reflection of the first Bragg grating and transmission of the second Bragg grating.

13. The lithographic apparatus of claim 12, wherein the deformation sensor comprises multiple combinations of first and second Bragg gratings, wherein the first and second Bragg grating of each combination have substantially the same Bragg wavelength range, and wherein each combination has another Bragg wavelength range than other combinations, and wherein the deformation sensor comprises one or more dispersive elements to direct the Bragg wavelength range of the measurement beam of each combination to one of multiple photo sensors.

14. The lithographic apparatus of claim 1, wherein the deformation sensor comprises a first Bragg grating and a second Bragg grating having substantially the same Bragg wavelength range, and wherein the interrogation system comprises at least one photo sensor to measure an intensity of a measurement light beam resulting of interference of reflection of the first Bragg grating and reflection of the second Bragg grating.

15. A method to monitor and/or control a deformation in an object of a lithographic apparatus, the method comprising:
determining a deformation of an object of the lithographic apparatus using a deformation sensor, wherein the deformation sensor comprises at least one optical fiber arranged on or in the object, the optical fiber comprising at least one Bragg grating, and an interrogation system to interrogate the at least one Bragg grating, and wherein the determining includes interrogating the at least one Bragg grating in the optical fiber, wherein interrogating with the interrogation system comprises analyzing, by the interrogating system, a light beam comprising one or more signals each with its own wavelength;
receiving and passing, by an entrance selector, at least part of said light beam;
receiving, by a first diffractor, at least part of said beam and diffracting in a first direction each of said signals at an angle dependent on said wavelength in a first plane of diffraction;
receiving, by a second diffractor, the diffracted signals and diffracting in a second direction each of said signals at an angle dependent on said wavelength in a second plane of diffraction, wherein said first plane of diffraction and second plane of diffraction are non-parallel to each other;
receiving, by a detector comprising a plurality of detector elements, the diffracted signals of the second diffractor and generating one or more detector output signals in dependence on the diffracted signals; and
receiving, by a processor connected to said detector, said detector output signals and determining the wavelength of each of said signals.

16. The method of claim 15, wherein the second diffractor is used to create a $+1^{st}$ order and a $-1^{st}$ order of at least one of the diffracted signals and wherein the detector elements are arranged to receive the $+1^{st}$ order and a $-1^{st}$ order of one of the diffracted signals to determine a wavelength of one of the one or more signals on the basis of interferometry between the $+1^{st}$ order and a $-1^{st}$ order of the respective one of the diffracted signals, wherein said first plane of diffraction and second plane of diffraction are substantially perpendicular to each other.

17. The method of claim 15, wherein the first plane of diffraction and the second plane of diffraction are substantially perpendicular to each other.

18. The method of claim 15, wherein the deformation sensor comprises a first Bragg grating and a second Bragg grating having substantially the same Bragg wavelength range, and wherein the interrogation system comprises at least one photo sensor to measure an intensity of a measurement light beam resulting of reflection of the first Bragg grating and transmission of the second Bragg grating.

19. The method of claim 15, the deformation sensor comprises a first Bragg grating and a second Bragg grating having substantially the same Bragg wavelength range, and wherein the interrogation system comprises at least one photo sensor to measure an intensity of a measurement light beam resulting of interference of reflection of the first Bragg grating and reflection of the second Bragg grating.

20. The method of claim 15, wherein the deformation sensor comprises multiple combinations of first and second Bragg gratings, wherein the first and second Bragg grating of each combination have substantially the same Bragg wavelength range, and wherein each combination has another Bragg wavelength range than other combinations, and wherein the deformation sensor comprises one or more dispersive elements to direct the Bragg wavelength range of the measurement beam of each combination to one of multiple photo sensors.

* * * * *